United States Patent
Culnane et al.

[11] Patent Number: 5,889,321
[45] Date of Patent: Mar. 30, 1999

[54] STIFFENERS WITH IMPROVED ADHESION TO FLEXIBLE SUBSTRATES

[75] Inventors: Thomas M. Culnane, Lanesboro, Pa.; Michael A. Gaynes, Vestal, N.Y.; Ramesh R. Kodnani; Mark V. Pierson, both of Binghamton, N.Y.

[73] Assignee: International Business Machines Corporation, Armonk, N.Y.

[21] Appl. No.: 877,538

[22] Filed: Jun. 17, 1997

[51] Int. Cl.$^6$ .................................................. H01L 23/48
[52] U.S. Cl. .......................... 257/701; 257/702; 257/778
[58] Field of Search ................................ 257/737, 738, 257/778, 701, 702

[56] References Cited

U.S. PATENT DOCUMENTS

| | | |
|---|---|---|
| 5,216,806 | 6/1983 | Lam . |
| 5,394,009 | 2/1995 | Loo . |
| 5,477,611 | 12/1995 | Sweis et al. . |
| 5,545,850 | 8/1996 | Mahulikar et al. . |
| 5,550,712 | 8/1996 | Crockett . |
| 5,767,528 | 6/1998 | Sumi et al. ............................ 257/778 |

*Primary Examiner*—Peter Toby Brown
*Assistant Examiner*—Roy Potter
*Attorney, Agent, or Firm*—Whitham, Curtis & Whitham; Arthur J. Samodovitz, Esq.

[57] ABSTRACT

A stiffener (34 or 52 or 72) includes a pathway which allows gases and fluids, such as air, to be vented from the interface between surface bonding regions (35 or 60 or 74) of the stiffener and an adhesive (38 or 56 or 80) on a flexible substrate (36 or 54 or 78). The pathway may take the form of a porous material used for the stiffener or one or more bore holes (58 or 59 or 70) formed in the stiffener. The stiffener may also include an internal cavity (76) for promoting venting of fluids and gases. By venting fluid and gases from the adhesive/stiffener interface, better adhesion between the stiffener and flexible substrate is achieved.

7 Claims, 3 Drawing Sheets

STIFFENERS WITH IMPROVED ADHESION TO FLEXIBLE SUBSTRATES

BACKGROUND OF THE INVENTION

1. Field of the Invention

The present invention generally relates to stiffener structures used on flexible substrates on which electrical components are mounted and, more particularly, to improving the adhesion of stiffener structures to flexible substrates.

2. Background Description

FIG. 1a shows an electronic module 8 that includes a stiffener structure 10 affixed by an adhesive 12 to a flexible substrate 14. The stiffener 10 maintains a region 16 of the flexible substrate 14 in a substantially planar orientation such that an electronic component 18, such as an integrated circuit chip or multilayer circuit package, can be connected to electrical wiring (not shown) on the surface of the substrate 14. These stiffener structures 10 may be used in connection with taped ball grid array devices or other electronic modules or packages. The substrate 14 is generally highly flexible and very thin (i.e., less than one tenth of an inch). Polyimides, such as KAPTON® available from DuPont, as well as other organic materials have been used as flexible substrates 14 for electronic components 18. The stiffener 10 typically will have an opening that allows the electrical component 18 to be affixed to the substrate 10 within the stiffener 10 opening after the stiffener is secured to the substrate.

FIG. 1b shows the underside of the electronic module 8. The electronic component 18 and region 16 are shown as dashed lines through the flexible substrate 14. Electrical connections (not shown) from the electrical component 18, are electrically connected to wiring 20 or ball connectors 21 on the flexible substrate 14, and the wiring 20 and/or ball connectors 21 are then used to secure the module 8 to a card or other suitable substrate (not shown). Vias (not shown) or other electrical connection configurations can be used to connect the electrical component 20 to the wiring 20 or ball connectors 21.

FIG. 2 shows an example electronic component 18 having a plurality of ball connectors 22. Contrasting FIG. 1b with FIG. 2, it can be seen that the ball connectors 22 are used to electrically connect the electrical component 18 to the wiring 20 and ball connectors on the flexible substrate 14. The ball connectors 22 are connected to electrical structures (i.e., transistors, resistors, capacitors, etc.) within the electrical component 18 are used to electrically connect these structures to circuitry positioned outside the component 18. If region 16 of substrate 14 is not planar, as is shown by rippled region 24 in FIG. 3, some of the connectors 22 will not be electrically connected to circuitry on the substrate 14. Rippling of the substrate 14 is a significant problem in organic modules that use a polymer tape or the like as the substrate. Rippling of the substrate 14 can occur even when stiffeners 10 are affixed to the substrate if the stiffeners are not securely connected to the adhesive 12.

SUMMARY OF THE INVENTION

It is an object of this invention to provide stiffener with improved adhesion to a flexible substrate.

According to the invention, a stiffener is provided with a pathway for venting air, or other fluids or gases, that become trapped between the stiffener and the adhesive on the substrate such that a more secure bond between the adhesive and the stiffener is created. In one embodiment of the invention, the stiffener or portions of the stiffener which are in contact with the adhesive are formed from a porous material which allows venting of fluids or gases from the interface between the stiffener and the adhesive out through the body of the stiffener. In another embodiment of the invention, one or more boreholes can be formed in the stiffener to allow venting from the surface bonding side of the stiffener into the holes and, most preferably, out through exit holes on a venting side of the stiffener. The stiffener may also include an internal cavity region which allows venting of fluids or gases. The stiffener can be affixed to either the same side of a flexible substrate as the electronic component, or the opposite side, with the only requirement being that the stiffener maintain a region of the substrate substantially planar for allowing the formation of good electrical connections between the electrical component and conductors and circuitry on the substrate. In configurations where the electronic component and stiffener are on the same side of the flexible substrate, the electronic component should be positioned within a cavity or opening in the stiffener body. In configurations where the electronic component and stiffener are on opposite sides of the flexible substrate, the stiffener may or may not have a cavity or opening formed therein and the stiffener and electronic component will be mounted in axial alignment on opposite sides of the flexible substrate.

BRIEF DESCRIPTION OF THE DRAWINGS

The foregoing and other objects, aspects and advantages will be better understood from the following detailed description of a preferred embodiment of the invention with reference to the drawings, in which:

FIG. 1b is a plan view of the bottom of the stiffener shown in FIG. 1a;

DETAILED DESCRIPTION OF THE PREFERRED EMBODIMENTS OF THE INVENTION

Figure 4:
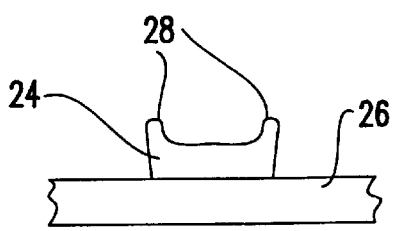
FIG. 4 is a cross-sectional side view of a stenciled adhesive on a flexible substrate.
Figure 5:
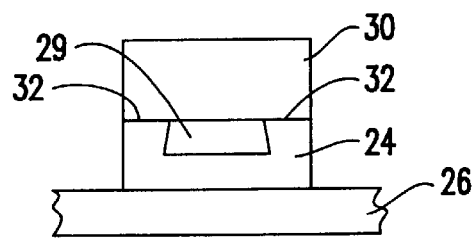
FIG. 5 is a cross-sectional side view of a stiffener only partially connected to the adhesive of FIG. 4 and having air pockets between the stiffener body and portions of the adhesive.

FIGS. 4 and 5 highlight a surface bonding problem for stiffeners discovered by the inventors. Specifically, the process of adhesively attaching the stiffener to the substrate is subject to reduced contact area due to trapped air, or other fluids or gases, between the adhesive surface and the surface of the stiffener to be attached. FIG. 4 illustrates that adhesives 24 applied to the surface of a substrate 26 with a stencil (not shown) are drawn to the stencil surfaces when the stencil is removed, thereby leaving raised edges 28 where the stencil contacted the adhesive 24. FIG. 5 shows that the raised edges 28 depicted in FIG. 4 facilitate trapping air or other fluids or gases in a non-adherent space 29 when a stiffener 30 is applied to the adhesive 24. Thus, stiffener 30 is only weakly secured to adhesive 24 at edge regions 32. The non-adherent space 29 cannot be removed simply by depressing stiffener 30 towards the substrate 26, since the adhesive 24 is typically an extremely viscous material and because such action may damage the substrate 26. It should be understood that non-adherent spaces 29 may arise in a variety of ways other than from the use of a stencil for screening the adhesive on a substrate 26, such as, for example, in adequate removal of moisture from the adhesive surface prior to joining of the stiffener to the substrate, and that all such non-adherent spaces 29 pose an adhesion problem for the stiffener 30.

This invention contemplates venting fluids or gases, such as air, which are trapped between an adhesive on a flexible substrate and a stiffener affixed to the adhesive, thereby minimizing or eliminating non-adherent spaces between the stiffener and the adhesive. Venting can be achieved by using porous materials to make the stiffener, providing porous regions in the stiffener, forming venting bore holes in the stiffener, including cavity regions in the stiffener, or by other means. The purpose of these venting structures is to vent gases and fluids, which likely will be "air" in most applications, from between the adhesive and the stiffener such that the occurrence of non-adherent spaces is minimized or eliminated.

Figure 6A:
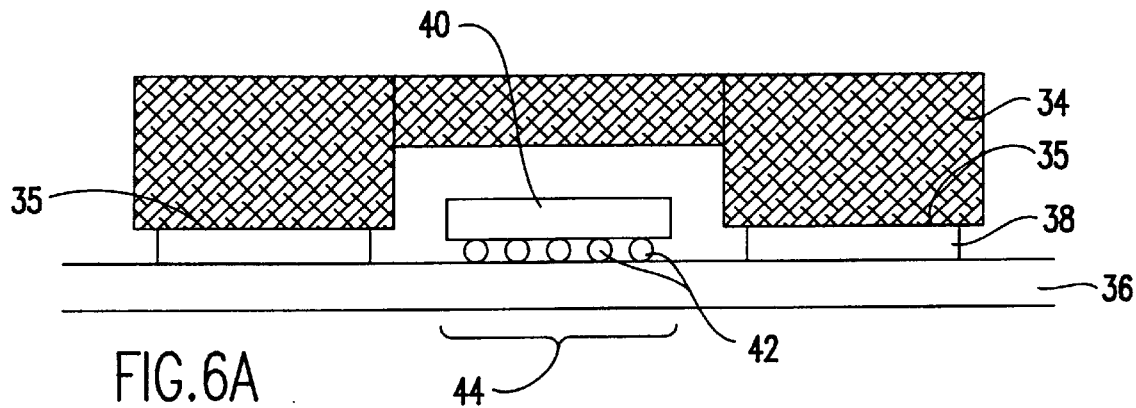
FIGS. 6a and 6b are cross-sectional side view of a stiffener made from a porous material affixed to a flexible substrate.
Figure 6B:
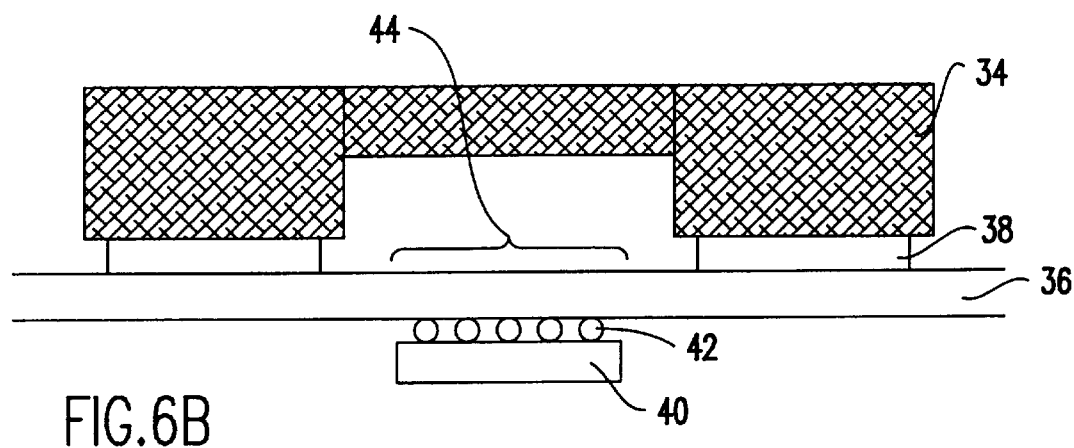

FIGS. 6a and 6b show an embodiment of the invention where the stiffener 34 is constructed from a porous material. For example, the stiffener 34 could be constructed from sintered metals such as stainless steel, copper, and aluminum. Alternatively, the stiffener 34 could also take the form of a foamed plastic or porous ceramic material. The stiffener 34 would be affixed to a flexible substrate 36 using an adhesive 38. The flexible substrate 36 would typically be thin (e.g., less than one tenth of an inch, and possibly as thin as a 10–100 mils). Typical materials which could be used as the substrate 36 include organic polymers, such as KAPTON® available from DuPont, metals and ceramics. While metals and ceramics are typically stiff enough not to require a stiffener device, such materials may be require a stiffener if the substrate is very thin. The stiffener 34 would be joined to the substrate 36 using an adhesive material 38 such as GE 3280 available from General Electric, Loctite 5404 available from the Loctite Corporation, and Dow X3-6325, available from Dow Corning Corporation. The adhesive 38 would be applied to the substrate 36 surface by screen printing, or by other means. Prior to joining the stiffener 34 to the adhesive 38, it is recommended that the flexible substrate 36 and adhesive 38 be baked to remove all moisture from the surface. For example, baking at 110° C. for 15 minutes is sufficient.

In the embodiment shown in FIGS. 6a and 6b, the porous nature of the stiffener 34 would allow fluids or gases, such as air, to escape from between the surface bonding regions 35 of the stiffener 34 and the adhesive 38 through the pores in the porous material. In addition to having a stiffener 34 fabricated completely from a porous material, the stiffener 34 may include both porous and non-porous regions. In this arrangement, the porous regions would be positioned to extend to the surface bonding regions 35 of the stiffener 34 to allow venting of fluids and gases from between the adhesive 38 and stiffener 34 interface.

Figure 1A:
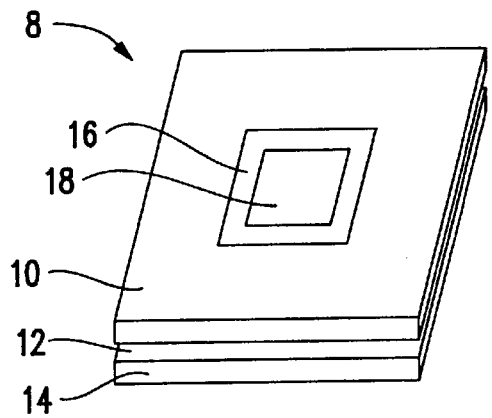
FIG. 1a is an isometric view of a stiffener positioned on a flexible substrate
Figure 1B:
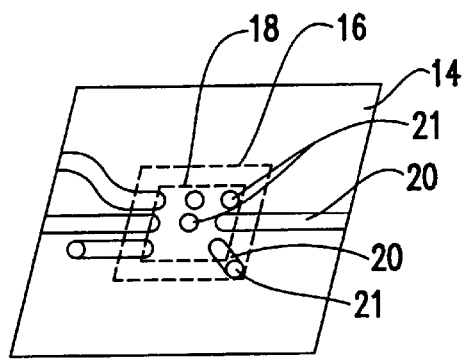
Figure 2:
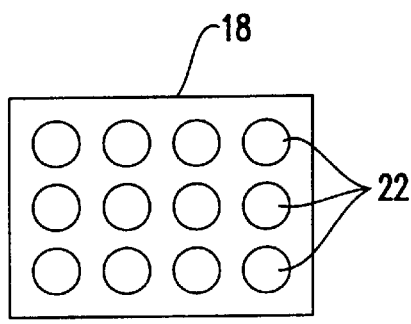
FIG. 2 is a plan view of the underside of an electronic component showing a plurality of ball connectors.
Figure 3:
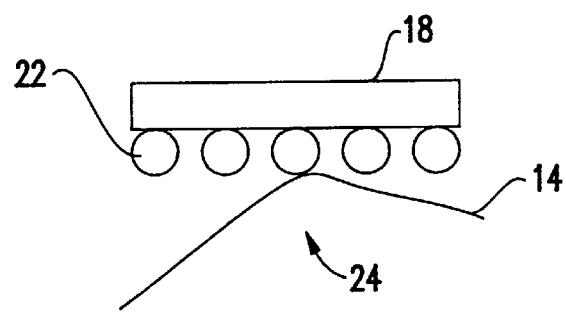
FIG. 3 is a side view of an electronic component only partially connected to a wrinkled flexible substrate.

The substrate 36 would have electrical conductors (not shown) positioned thereon to join with an electronic component 40, such as an integrated circuit chip or multilayer ceramic package, and may also include circuitry and additional electrical components (not shown). The electronic component 40 can be electrically and mechanically joined to conductors on the substrate using ball connectors 42, or other connecting devices. As discussed in conjunction with FIGS. 1a and 1b, the flexible substrate 36 can be trimmed to the size of the stiffener 34 such that an electronic module which is joinable to electronic cards or other substrates is created. In addition, the flexible substrate 36 can be provided with wiring and/or connectors (not shown) to enable it to be joined to a card or other substrate.

In FIGS. 6a and 6b, the stiffener 34 defines an area 44 which is not bonded to the substrate 36. The region of the substrate 36 defined by this area 44 is held substantially planar by the stiffener 34 when it is affixed to the substrate 36 using the adhesive 38. The main function of the stiffener 34 is to maintain this substantially planar configuration of the substrate 36 in the region underlying area 44 such that the electronic component 40 can be electrically joined to the conductors on the substrate 36 with precision. As can be seen from FIGS. 6a and 6b, the region of the substrate 36 to which the electronic component 40 is joined can be on the same side or the opposite side of the substrate 36 as the stiffener 34. Although not shown in the Figures, it would also be possible to have separate electronic components positioned on both the same side and the opposite side of the substrate 36 in the region corresponding to area 44, and to provide for electrical communication between the two electrical components through openings (not shown) formed in the substrate 36.

Figure 6C:
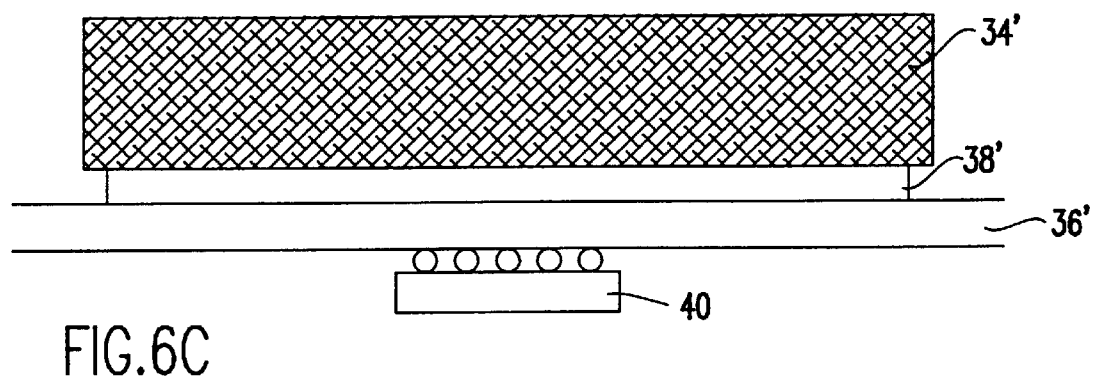
FIG. 6c is a cross-sectional side view of a stiffener made of a porous material where the stiffener does not include a cavity and the stiffener and electronic component are mounted on opposite sides of a flexible substrate.

FIG. 6c shows a porous stiffener 34' similar to that shown in FIGS. 6a and 6b in that it provides for venting of fluids or gases from between the stiffener 34' and adhesive 38'. However, because the stiffener 34' and the electronic component 40 are positioned on opposite sides of the flexible substrate 36', the stiffener 34' does not need to define an area (cavity or opening) that is not joined to the substrate 36'. Rather, the adhesive 38' expands over the entire under surface of the stiffener 34', and the electronic component 40 and stiffener 34' are mounted on opposite sides of the substrate 36' in axial alignment through the substrate 36'. In this way, the stiffener 34' maintains the substrate 36' flat for mounting the component 40 and making connections to electrical wiring (not shown) on the surface of the substrate 36'.

Figure 7:
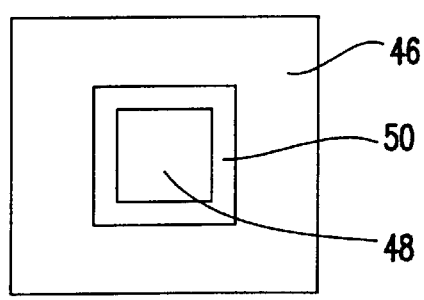
FIG. 7 is a schematic plan view of a stiffener with an electronic component positioned within a central opening.

FIG. 7 schematically shows a stiffener 46, according to one aspect of this invention. The stiffener 46 can have almost any size and configuration and its size and shape will typically depend on the size and shape of the electronic component 48 to be connected to the flexible substrate. Preferably, the stiffener will have an opening 50 which will allow placement of the electronic component 48 within a non-bonded area defined by the stiffener 46 after the stiffener 46 is attached to the substrate (not shown). However, it should be apparent from FIG. 6c that the stiffener could be designed to lack an opening 50 in applications where the electronic component will be connected to the substrate on the opposite side of the substrate. While FIG. 7 shows a generally square configuration for the stiffener 46, it should be understood that the stiffener can be any shape (e.g., rectangular, circular, etc.) to fit the needs of a particular application. The thickness of the stiffener 46 will generally be between 0.010 and 0.040 inches; however, the thickness will vary depending upon the application.

Figure 8A:
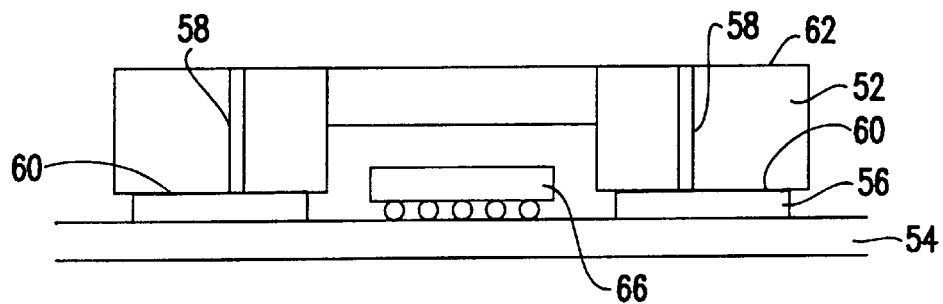
FIGS. 8a–c are cross-sectional side views of stiffeners with bore holes affixed to a flexible substrate.
Figure 8B:
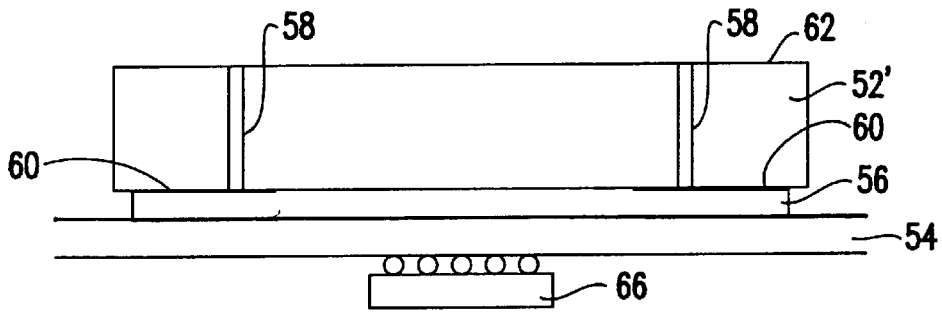
Figure 8C:
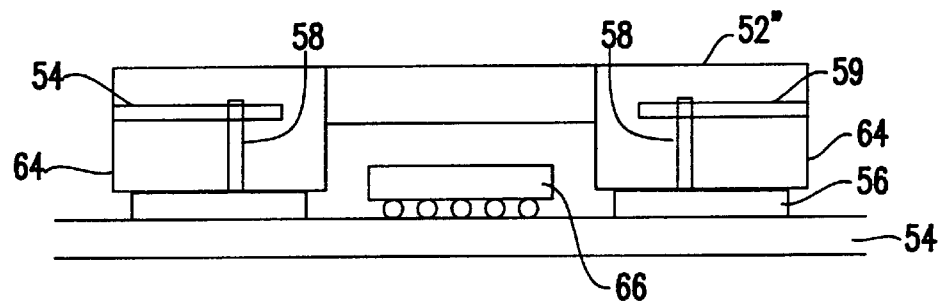

FIGS. 8a–c illustrate another embodiment of this invention where the stiffener 52 or 52' or 52" joined to the substrate 54 by the adhesive 56 will have one or more bore holes 58 that extend from the surface bonding regions 60 of the stiffener 52 or 52' or 52" to allow fluids and gases to be vented from the interface between the surface bonding regions 60 and the adhesive 56. FIGS. 8a and 8b show a configuration where the bore holes 58 extend through the stiffener 52 or 52' to a vented surface 62 that is on the opposite side of the stiffener 52 or 52' from the surface bonding region 60.

FIG. 8c shows a configuration where the bore holes 58 in stiffener 52" are intersected by lateral bore holes 59. The lateral bore holes 59 extend to a vented surface 64 that is adjacent the surface bonding regions 60 of the stiffener 52". In any of the configurations, the stiffener 52 or 52' or 52" allows fluids and gases present between the adhesive 56 and the surface bonding regions 60 to escape through the boreholes 58 and 59 through the vented surface 62 or 64. FIGS. 8a and 8b, show that the electronic component 66 can be connected to the substrate 54 on either the same side or the opposite side as the stiffener 52 or 52', as explained above in conjunction with FIGS. 6a and 6b. In addition, FIG. 8b shows a stiffener 52' that does not include an opening, and is similar to that described in conjunction with FIG. 6c.

Figure 9A:
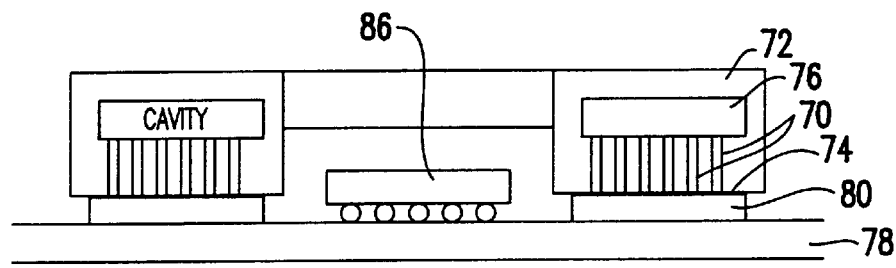
FIGS. 9a–b are cross-sectional side views of stiffeners affixed to a flexible substrate which include an internal cavity in the stiffener body.
Figure 9B:
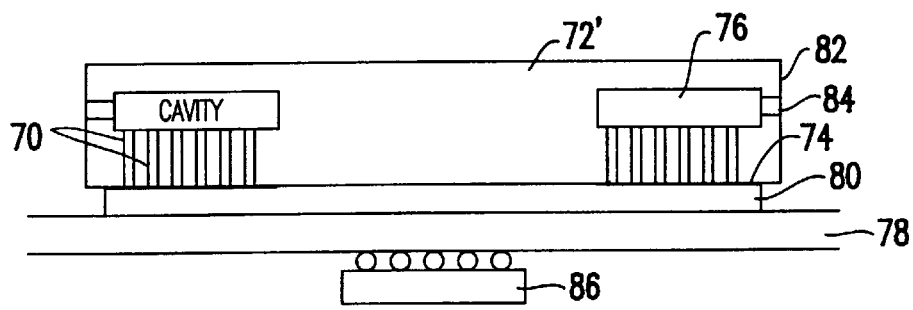

FIGS. 9a and 9b show a further variation on the invention wherein a plurality of bore holes 70 are formed in the stiffener 72 or 72' and extend between a surface bonding region 74 and an internal cavity 76 created in the stiffener 72 or 72'. When the stiffener 72 or 72' is affixed to the substrate 78 by adhesive 80, gases and fluids at the interface of the adhesive 80 and the surface bonding regions 74 of the stiffener 72 or 72' will be vented to the cavity 76 so that good adhesion between the stiffener 72 or 72' and the substrate 78 is achieved. FIG. 9b shows a configuration where the cavity 76 is connected to a vented surface 82 of the stiffener 72' by a bore hole 84, thus allowing gases or fluids provided to the cavity 76 by the bore holes 70 to exit the stiffener 72'. As discussed above, FIG. 9b also shows a configuration where the stiffener 72' does not include an opening and the electronic component 86 is connected on a side of the substrate 78 opposite the stiffener 72'.

While the invention has been described in terms of its preferred embodiments, those skilled in the art will recognize that the invention can be practiced with considerable variation within the spirit and scope of the appended claims.

We claim:

1. A stiffener for a flexible substrate, comprising:
   a stiffener body having a plurality of surface bonding regions for bonding to a substrate and defining an area between said surface bonding regions which is not bonded to a substrate; and
   a pathway in said stiffener body which extends from said surface bonding regions into said stiffener body which allows fluid or gas movement from said surface bonding region into said pathway in said stiffener body, wherein said pathway extends from said surface bonding, regions through said stiffener body to a cavity within said stiffener body.

2. The stiffener of claim 1 wherein said pathway extends from said cavity within said stiffener body to a vented surface on said stiffener body.

3. A stiffener for a flexible substrate, comprising:
   a stiffener body having a plurality of surface bonding regions for bonding to a substrate and defining an area between said surface bonding regions which is not bonded to a substrate; and
   a pathway in said stiffener body which extends from said surface bonding regions into said stiffener body which allows fluid or gas movement from said surface bonding region into said pathway in said stiffener body, wherein said pathway is comprised of at least one bore hole in said stiffener body.

4. The stiffener of claim 3 wherein said pathway is comprised of a plurality of bore holes in said stiffener body.

5. A stiffener for a flexible substrate, comprising:
   a stiffener body having a plurality of surface bonding regions for bonding to a substrate and defining an area between said surface bonding regions which is not bonded to a substrate; and
   a pathway in said stiffener body which extends from said surface bonding regions into said stiffener body which allows fluid or gas movement from said surface bonding region into said pathway in said stiffener body, wherein said stiffener body is constructed from a porous material, and said pathway is comprised of pores in said porous material.

6. A stiffener for a flexible substrate, comprising:
   a stiffener body having a plurality of surface bonding regions for bonding to a substrate and defining an area between said surface bonding regions which is not bonded to a substrate; and
   a pathway in said stiffener body which extends from said surface bonding regions into said stiffener body which allows fluid or gas movement from said surface bonding region into said pathway in said stiffener body, wherein said stiffener body includes a plurality of regions constructed of porous material, and wherein said regions constructed of said porous material extend to said surface bonding region, and wherein said pathway is comprised of pores in said porous material.

7. A stiffener for a flexible substrate, comprising:
   a stiffener body having a plurality of surface bonding regions for bonding to a substrate and defining an area between said surface bonding regions which is not bonded to a substrates;
   a pathway in said stiffener body which extending from said surface bonding regions into said stiffener body which allows fluid or gas movement from said surface bonding region into said pathway in said stiffener body; and
   a vented surface, wherein said pathway extends through said stiffener body between said surface bonding regions and said vented surface, and wherein said vented surfaces is positioned on a side of said stiffener that is selected from the group consisting of opposite said surface bonding regions and adjacent said surface bonding regions.

* * * * *